United States Patent [19]
Yamaguchi

[11] Patent Number: 5,517,460
[45] Date of Patent: May 14, 1996

[54] SEMICONDUCTOR INTEGRATED CIRCUIT AND IC CARD USING THE SAME

[75] Inventor: Atsuo Yamaguchi, Itami, Japan

[73] Assignee: Mitsubishi Denki Kabushiki Kaisha, Tokyo, Japan

[21] Appl. No.: 117,661

[22] Filed: Sep. 8, 1993

[30]    Foreign Application Priority Data

Sep. 11, 1992  [JP]  Japan ................... 4-243507

[51] Int. Cl.⁶ .................................................. G11C 7/00
[52] U.S. Cl. ............... 365/233; 365/189.01; 365/189.05; 235/380; 235/451; 235/492
[58] Field of Search ......................... 365/189.01, 189.05, 365/200, 201, 218; 235/380, 452, 492, 233

[56]              References Cited

U.S. PATENT DOCUMENTS

| | | | |
|---|---|---|---|
| 4,752,871 | 6/1988 | Spark et al. ............... | 365/218 |
| 4,780,602 | 10/1988 | Kawana et al. ............ | 235/380 |
| 5,036,460 | 7/1991 | Takahira et al. ............ | 364/200 |
| 5,109,359 | 4/1992 | Sakakibara et al. ......... | 365/201 |
| 5,375,083 | 12/1994 | Yamaguchi ................ | 365/185 |
| 5,386,539 | 1/1995 | Nishi ......................... | 235/492 |
| 5,406,064 | 4/1995 | Takahashi .................. | 235/492 |

FOREIGN PATENT DOCUMENTS

| | | |
|---|---|---|
| 0374935 | 6/1990 | European Pat. Off. . |
| 0376285 | 7/1990 | European Pat. Off. . |
| 0488366 | 6/1992 | European Pat. Off. . |

OTHER PUBLICATIONS

Data Sheets for MY5802–XXXF Smart Card, Mitsubishi Electric Company, 1992.

Jones, "Intelligent EEPROM Adds New Dimensions To Nonvolatile Memory", WESCON/83, 1983, pp. 1–4.

Cioaca et al, "A Million Cycle CMOS 256K EEPROM", IEEE Journal of Solid–State Circuits, vol. SC–22, No. 5, 1987, pp. 684–692.

*Primary Examiner*—Tan T. Nguyen
*Attorney, Agent, or Firm*—Leydig, Voit & Mayer

[57]             ABSTRACT

A semiconductor integrated circuit includes: a writable non-volatile memory; a writing voltage-generating circuit for generating a writing voltage and supplying it to the non-volatile memory; an oscillating circuit for generating a first clock signal and supplying it to the writing voltage-generating circuit; a timer for measuring a time the writing voltage generated in the writing voltage-generating circuit is applied to the non-volatile memory; a control circuit for controlling writing in the non-volatile memory; and a switching device for selecting one of the first clock signal generated in the oscillating circuit and a second clock signal input from outside the integrated circuit in response to a control signal from the control circuit, thereby supplying the selected signal to the timer and the control circuit as a clock.

10 Claims, 7 Drawing Sheets

SEMICONDUCTOR INTEGRATED CIRCUIT AND IC CARD USING THE SAME

BACKGROUND OF THE INVENTION

1. Field of the Invention

The present invention relates to an IC card connected to an external device for executing data processing and a semiconductor integrated circuit used for the same.

2. Description of the Related Art

The construction of a conventional IC card 20 is shown in FIG. 6. A ROM 24, an EEPROM 25 and a RAM 26 are connected via a system bus 22 to a CPU 21 for executing calculations and controlling operations required for data processing. The ROM 24 writes a program for executing various functions used by a card user. The EEPROM 25 writes individual information, or the like, of a card user. The RAM 26 temporarily stores the data required for data processing. An input/output (I/O) circuit 27 for data I/O communication with an external unit is also connected to the system bus 22. The conventional IC card also includes terminals such as a positive-power supply input terminal P1, a negative-power supply ground terminal P2, a reset terminal P3 for receiving a reset signal to initialize the CPU 21, a clock terminal P4 for receiving an external clock signal Xin, and an I/O terminal P5 for data I/O processing.

A block diagram of the EEPROM 25 is shown in FIG. 7. A memory array 1 has a plurality of word lines 1a from an X decoder 2 to a plurality of VppSWs switches 7 and a plurality of bit lines 1b from a Y gate 3 to a plurality of VppSWs switches 8. Each of memory cells 1c is connected at the intersection of the word line 1a and the bit line 1b.

The control circuit 11 is a sequential circuit having four states such as READY, LATCH, ERASE and WRITE using an internal clock signal $\phi_1$ of a machine cycle of the CPU 21 as a clock. The READY state is not a writing state of the control circuit 11. The control circuit 11 outputs a latch signal, an erase signal and a write signal in the LATCH, ERASE and WRITE states, respectively. Upon detection that is being written by the CPU 21 into the EEPROM 25, the control circuit 11 goes into the LATCH state and sequentially stores the data supplied from the CPU 21 to a column latch 9. The control circuit 11 also goes into the ERASE state in response to a write instruction from the CPU 21, and then, to the WRITE state, and is finally completed.

In accordance with the internal clock signal $\phi_1$ generated by the CPU 21, the timer 12 measures the time required from latching of data to the next following data and the time required from latching the data to inputting a write instruction. When the measured time exceeds a predetermined time out period, the control circuit 11 determines that an abnormal condition exists, thus nullifying and not completing the previous operation. When the control circuit 11 generates an erase signal and a write signal, it also outputs a Vpp generating signal to the charge pump 10. When the Vpp generating signal is input into the charge pump 10 from the control circuit 11, the charge pump 10 raises the Vcc power supply voltage by an external clock signal Xin which is input via the clock terminal P4 and generates the high voltage Vpp for writing and supplies it to the VppSWs switches 7 and 8.

According to an address signal stored in an address latch 13, the X decoder 2 and the Y decoder 4 selects the word line 1a and the Y gate 3, respectively. A signal from the CPU 21 is input into the selected Y gate 3 via a data bus and a driver 5. The signal from the Y gate 3 is connected to the data bus via a sense amplifier 6.

The VppSW switches 7 supply the high voltage Vpp for the writing supplied from the charge pump 10 to the word line 1a selected by the X decoder 2. The VppSW switches 8 supply the high voltage Vpp to the respective bit lines 1b on the basis of information stored in the column latch 9. The writing data from the driver 5 is stored in the column latch 9 by way of the selected bit line 1b and VppSW switch 8.

In general, since an EEPROM requires a long write time, a plurality of data items to be written are stored in the column latch 9 and written in the memory cells 1c on the selected word lines 1a, simultaneously, thereby effectively reducing the write time.

A gate 15 generates a signal for selecting an EEPROM in accordance with the address signal from the CPU 21. A rise control circuit 14 for raising the high voltage Vpp slowly operates in accordance with the internal clock signal $\phi_1$ from the CPU 21 and outputs a rise control signal to the charge pump 10.

However, the conventional EEPROM has the following problems. As stated above, the external clock signal Xin which is input via the clock terminal P4 for the operation of the CPU 21 and supplied to the CPU 21 is also used as a clock of the charge pump 10 of the EEPROM 25. Hence, when the frequency of the external clock signal Xin is lowered in order to vary the operation speed of the CPU 21, the high voltage Vpp for writing generated from the charge pump 10 is also lowered, thus inhibiting correct operation.

Also, the frequency of the internal clock signal $\phi_1$ generated in the CPU 21 is changed as the frequency of the external clock signal Xin is changed. Further, the write time determined by the timer 12 operating according to the internal clock signal $\phi_1$ is inevitably changed, thus making it difficult to ensure the optimal write time for guaranteeing the reliability of the memory cell 1c and for sufficient writing.

SUMMARY OF THE INVENTION

Accordingly, in order to overcome the above drawbacks, an object of the present invention is to provide a semiconductor integrated circuit which is capable of ensuring correct operation and optimal write time regardless of the frequency of a clock signal input from an external unit and to provide an IC card using the same.

In order to achieve the above objects, according to a first aspect of the present invention, there is provided a semiconductor integrated circuit comprising: a writable non-volatile memory; a writing voltage-generating circuit for generating a writing voltage and supplying it to the non-volatile memory; an oscillating circuit for generating a first clock signal supplied to the writing voltage-generating circuit; a timer for measuring a time required for applying the writing voltage generated in the writing voltage-generating circuit to the non-volatile memory; a control circuit for controlling writing to the non-volatile memory; and switching means for selecting one of the first clock signal generated in the oscillating circuit and a second clock signal input externally in accordance with a control signal from the control circuit, thereby supplying the selected signal to the timer and the control circuit as a clock.

According to a second aspect of the present invention, there is provided an IC card comprising: a CPU operating according to a second clock signal for processing data; a ROM storing a program for operating the CPU; a RAM for temporarily storing data; an input/output circuit for data input/output processing for communicating with an external unit; a writable non-volatile memory; a writing voltage-generating circuit for generating a writing voltage and supplying it to the non-volatile memory; an oscillating circuit for generating a first clock signal supplied to the writing voltage-generating circuit; a timer for measuring a time required for applying the writing voltage generated in the writing voltage-generating circuit to the non-volatile memory; a control circuit for controlling writing in the non-volatile memory; and switching means for selecting one of the first clock signal generated in the oscillating circuit and a second clock signal input from the CPU in accordance with a control signal from the control circuit, thereby supplying the selected signal to the timer and the control circuit as a clock.

According to a third aspect of the present invention, there is provided an IC card comprising: a CPU operating according to a second clock signal for data processing; a ROM storing a program for operating the CPU; a RAM for temporarily storing data; an input/output circuit for data input/output processing for communicating with an external unit; a writable non-volatile memory; a writing voltage-generating circuit for generating a writing voltage supplied to the non-volatile memory; an oscillating circuit for generating a first clock signal supplied to the writing voltage-generating circuit; a timer controlled by the CPU, for measuring a time required for applying the writing voltage generated in the writing voltage-generating circuit to the non-volatile memory; and a control register directly set and reset by the CPU, the register controlling writings of data in the non-volatile memory.

DESCRIPTION OF THE PREFERRED EMBODIMENTS

Figure 1:
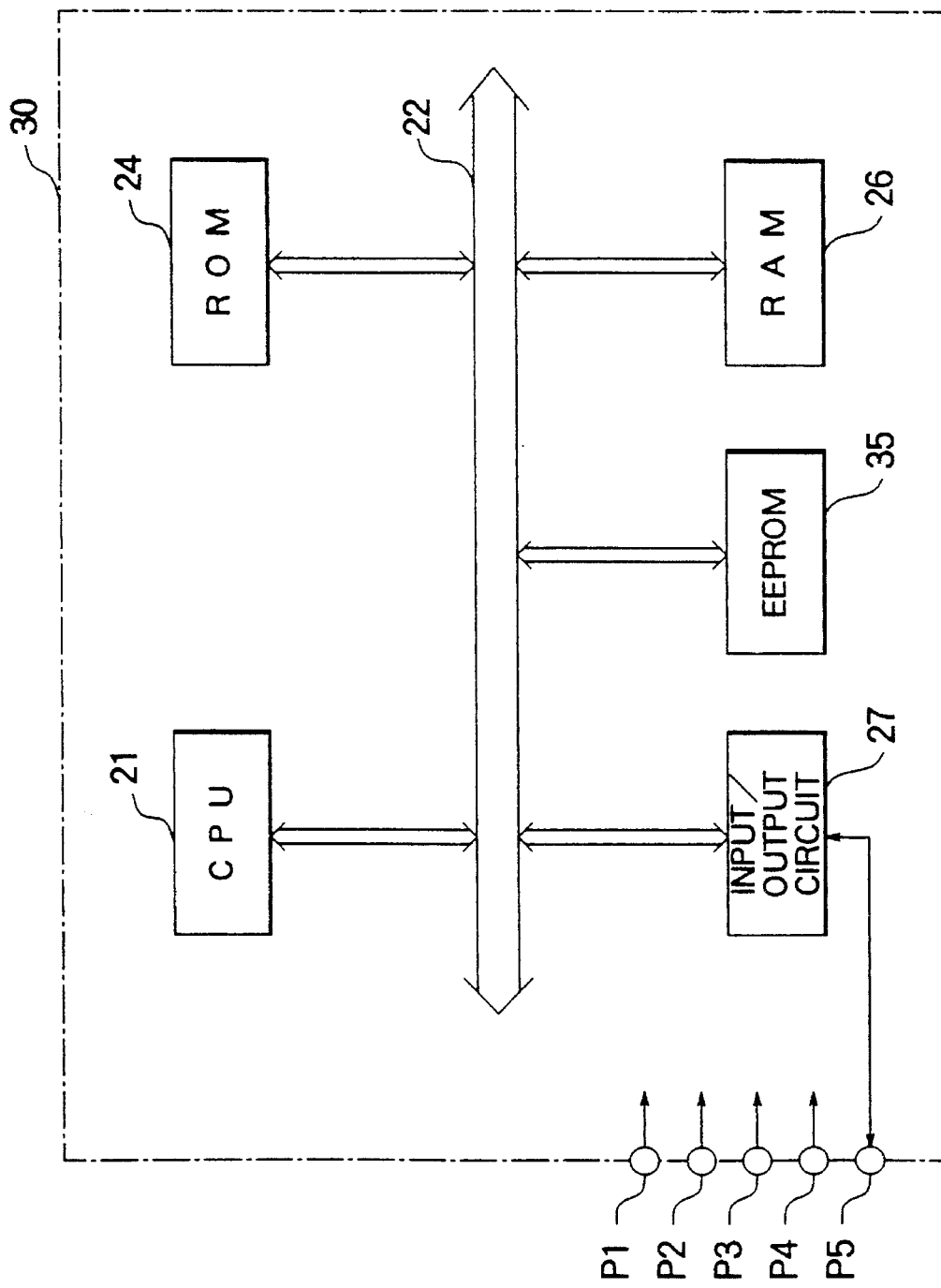
FIG. 1 is a block diagram showing an IC card of one embodiment according to the present invention.

An embodiment of the present invention will now be described with reference to the accompanying drawings. Reference will first be made to an IC card shown in FIG. 1. A ROM 24, an EEPROM 35 and a RAM 26 are connected via a system bus 22 to a CPU 21 for executing calculations and controlling operations required for data processing. An input/output (I/O) circuit 27 for data I/O processing for communication with an external unit is also connected to the system bus 22. The IC card of the present invention includes terminals such as a positive-power supply input terminal P1, a negative-power supply ground terminal P2, a reset terminal P3 for receiving a reset signal for initializing the CPU 21, a clock terminal P4 for receiving an external clock signal Xin, and an I/O terminal P5 for data I/O processing.

Figure 2:
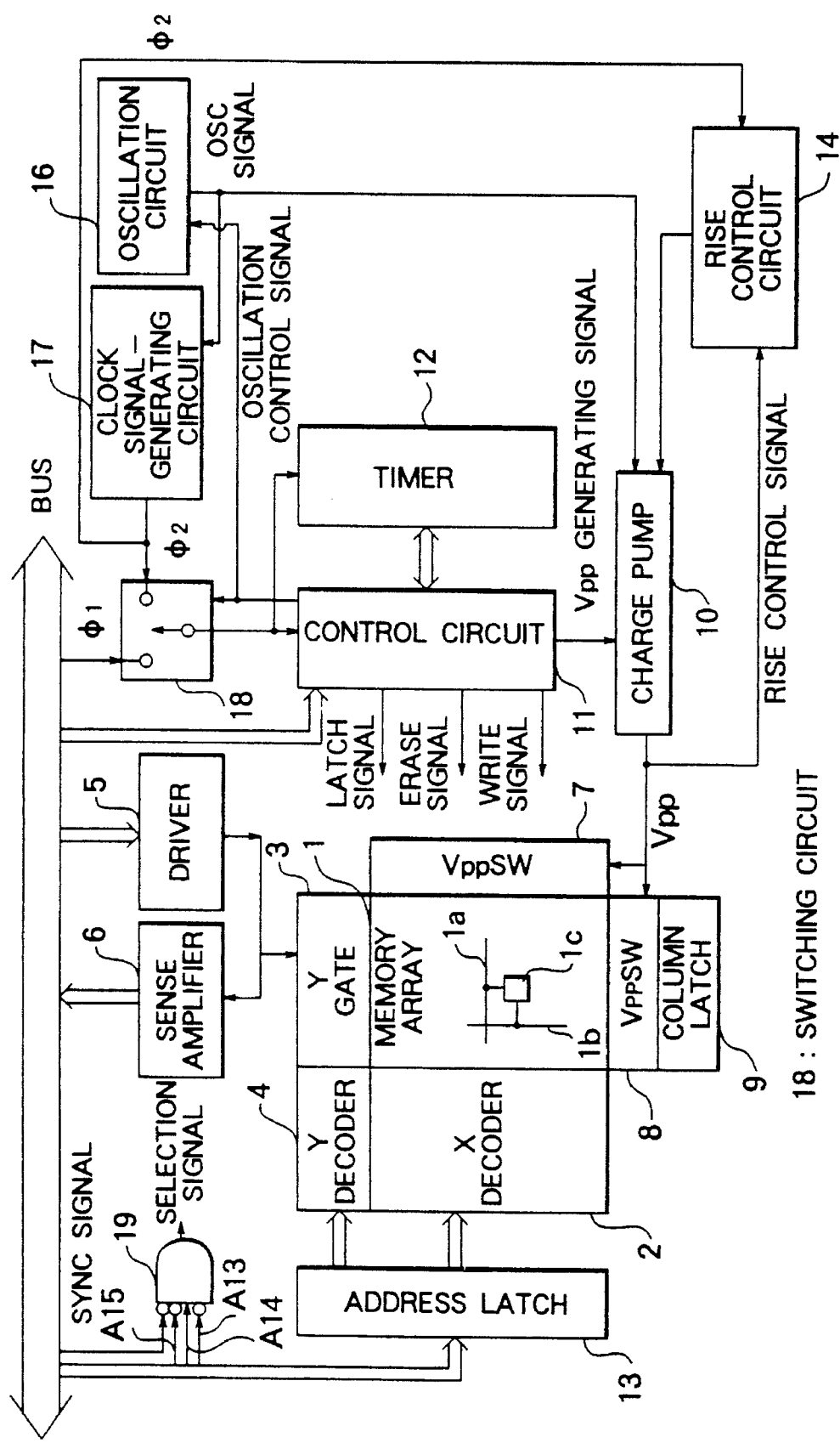
FIG. 2 is a block diagram showing the construction of an EEPROM used for the IC card shown in FIG. 1.
Figure 7:
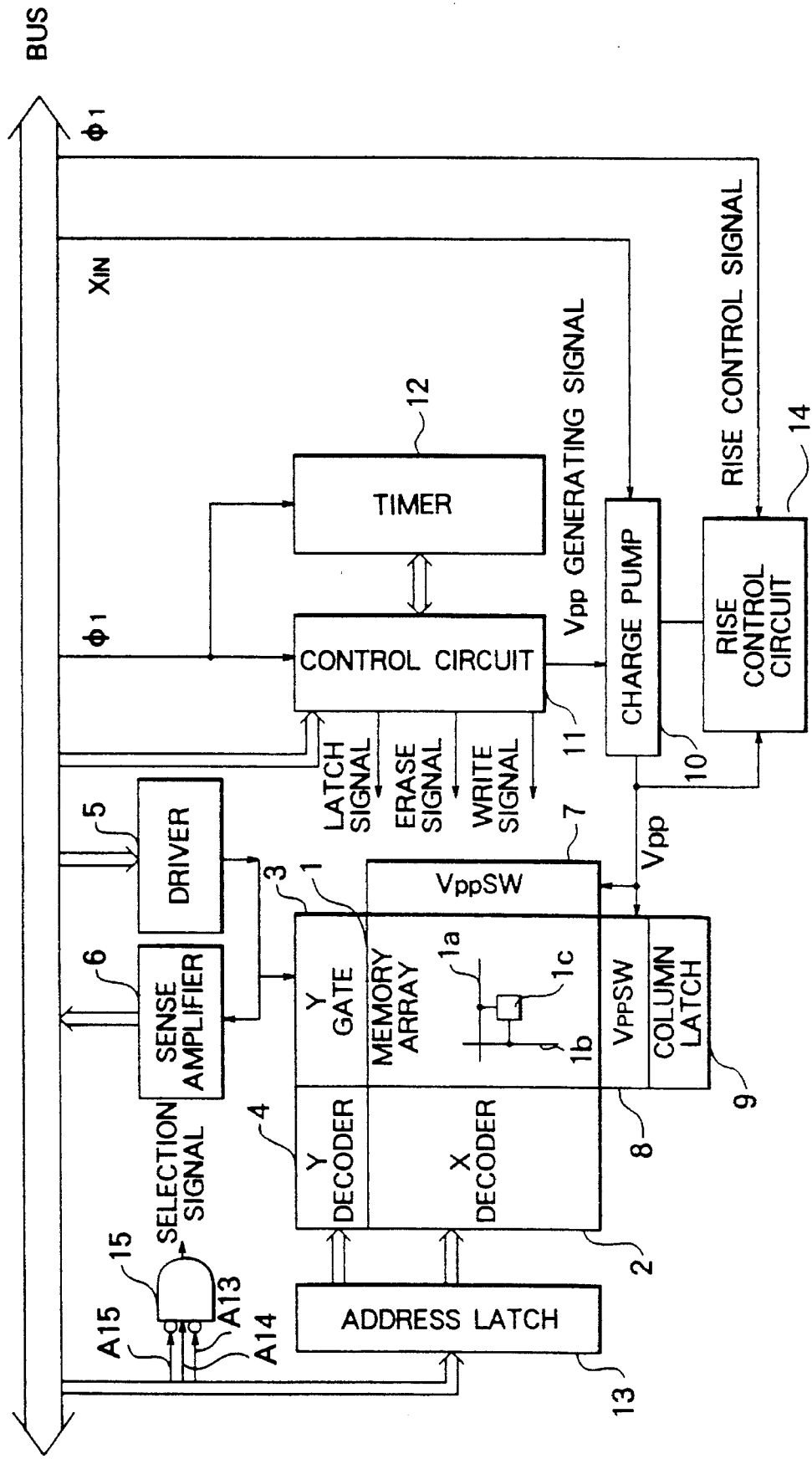
FIG. 7 is a block diagram showing the construction of an EEPROM used for the IC card shown in FIG. 6.

A block diagram of an EEPROM 35 is shown in FIG. 2. A memory array 1, an X decoder 2, a Y gate 3, a Y decoder 4, a driver 5, a sense amplifier 6, VppSW switches 7 and 8, a column latch 9, a charge pump 10, a control circuit 11, a timer 12, an address latch 13 and a rise control circuit 14 are similar components to those shown in FIG. 7 having the same reference numerals.

The charge pump 10 and a clock signal-generating circuit 17 are connected to an oscillating circuit 16 which is further connected to the control circuit 11. The control circuit 11 and the timer 12 are connected to the clock signal-generating circuit 17 via a switching circuit 18. The rise control circuit 14 is also connected to the clock signal-generating circuit 17. The oscillating circuit 16 produces an OSC signal according to an oscillating control signal generated by the control circuit 11 that it supplied to the charge pump 10 and the clock signal-generating circuit 17 which generates a clock signal $\phi_2$ in response to the OSC signal. The switching circuit 18 selects one of the internal clock signal $\phi_1$ generated by the CPU 21 and the clock signal $\phi_2$ generated by the clock signal-generating circuit 17. Specifically, the control circuit 11 outputs the oscillation control signal to the oscillation circuit 16 which, in response thereto, generates and outputs the OSC signal to both the charge pump 10 and the clock signal generating circuit 17. The clock signal generating circuit 17 outputs the clock signal $\phi_2$ to the switching circuit 18 and the rise control circuit 14. The switching circuit 18 supplies the external clock signal $\phi_1$ to the control circuit 11 and the timer 12.

A gate 19 generating a selection signal so as to access the EEPROM 35 inputs address signals A13–A15 and an SYNC signal which is generated by the CPU 21 when it reads an instruction word. In this embodiment, when an SYNC signal is generated, a selection signal is not generated from the gate 19, and thus, an instruction word cannot be read from the EEPROM 35, thereby inhibiting the EEPROM 35 from storing a program.

Figure 3:
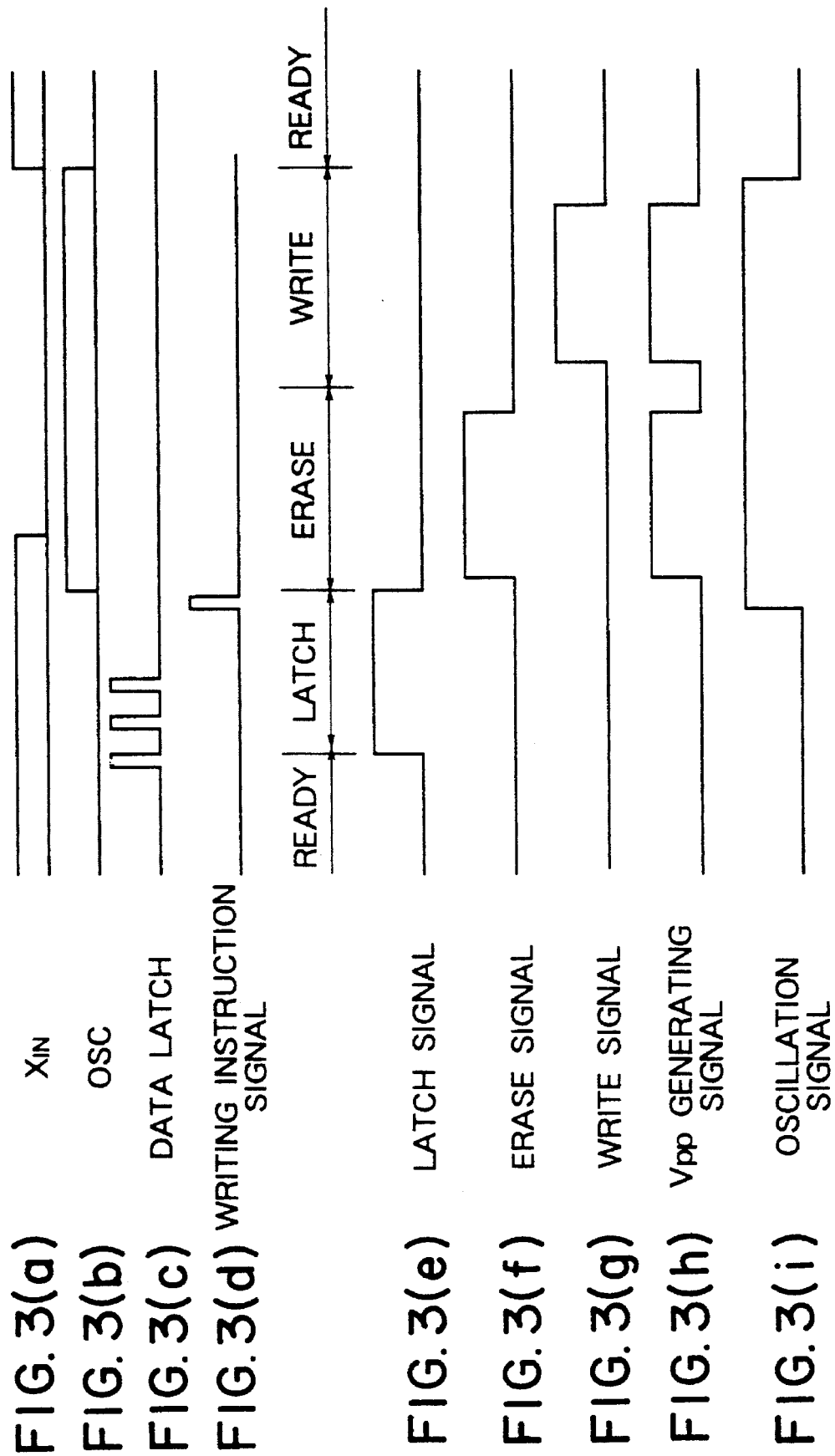
FIG. 3 is a timing chart indicating the operation of the EEPROM shown in FIG. 2.
Figure 4:
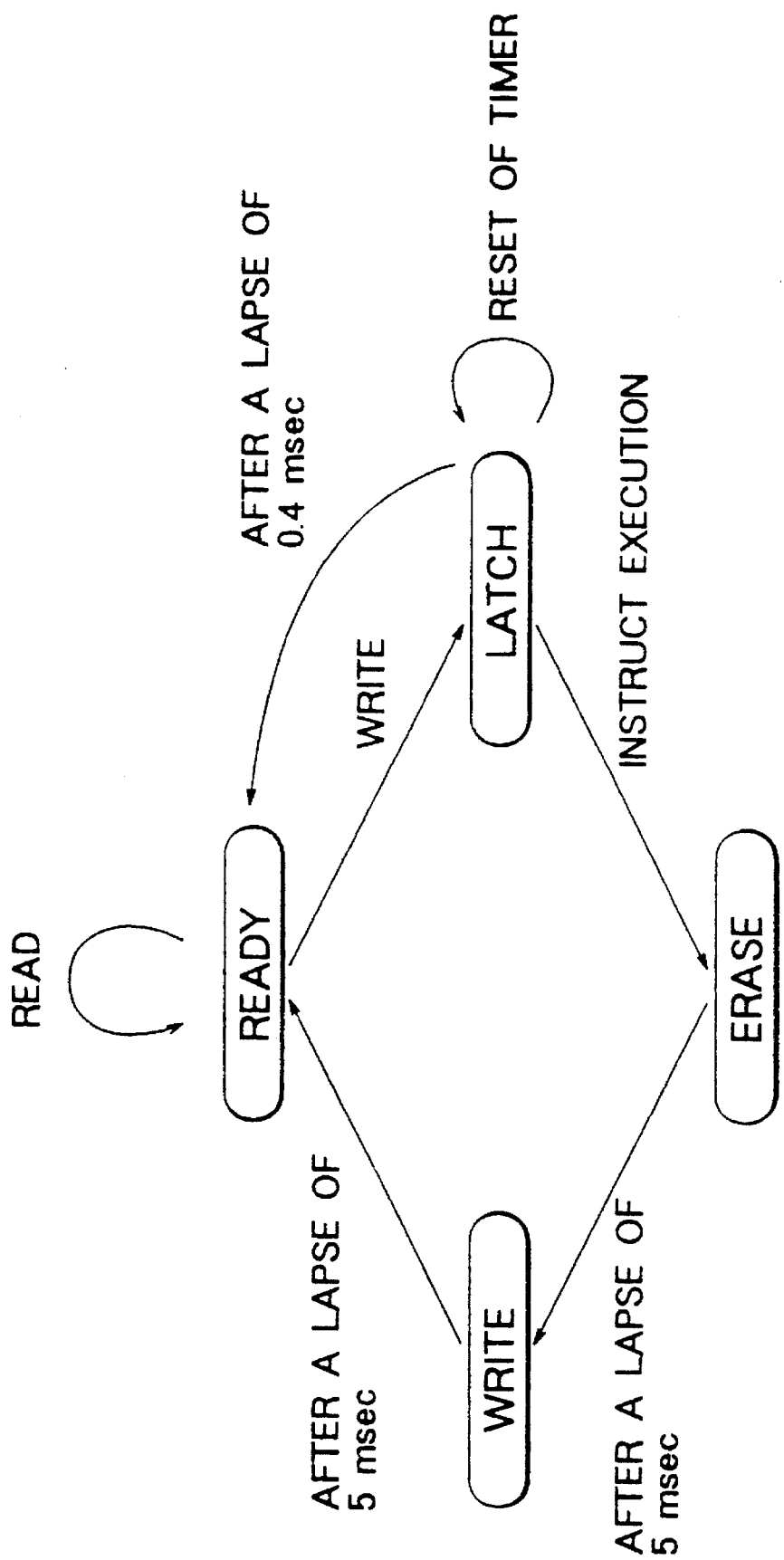
FIG. 4 shows the state transitions of a control circuit used for the EEPROM shown in FIG. 2.

The operation of this embodiment will now be explained with reference to a timing chart in FIG. 3 and the state transition diagram shown in FIG. 4. The control circuit 11 outputs a high-level oscillation control signal when it is in either of the ERASE or WRITE states. Then, an OSC signal is generated from the oscillating circuit 16 and the switching circuit 18 selects the clock signal $\phi_2$ generated by the clock signal-generating circuit 17 and supplies it to the control circuit 11 and the timer 12.

When the CPU 21 writes into the EEPROM 35 in the READY state of the control circuit 11, a high-level selection signal is generated from the gate 19, thereby changing the state of the control circuit 11 from READY into LATCH. At this time, the CPU 21 executes writing for the number of times required for the same page. The address and data to be written are latched in the address latch 13 and in the column latch 9, respectively. The timer 12 is cleared every time the CPU 21 writes a new address or data. When a predetermined time required for executing the next writing step by the CPU 21, that is, for latching the next data item in the column latch 9, reaches, for example, 0.4 ms, the state of the control circuit 11 is changed into READY and the data latched by the previous writing is nullified. Or the control circuit 11 may change to the ERASE state.

A writing instruction signal for the execution of writing is input into the control circuit 11 from the CPU 21, thereby changing the state of the control circuit 11 to the ERASE state and raising an oscillation control signal, a Vpp generating signal and an erase signal to a higher level. Due to such a high-level oscillation control signal, an OSC signal is generated from the oscillating circuit 16 and the switching circuit 18 selects the clock signal $\phi_2$ generated by the clock signal-generating circuit 17 and supplies it to the control circuit 11 and the timer 12. The clock signal $\phi_2$ is supplied to the rise control circuit 14 from which a rise control signal is output to the charge pump 10. The OSC signal from the oscillating circuit 16 and the high-level Vpp generating signal from the control circuit 11 are input into the charge pump 10, thereby generating a high voltage Vpp used for writing according to the rise control signal.

The control circuit 11 starts to count the erase time using the timer 12, and after a lapse of a predetermined time, for example, 5 ms, it is changed into the WRITE state, thus dropping the erase signal to a lower level and raising the write signal to a higher level.

The control circuit 11 starts to count the write time using the timer 12, and after a lapse of a predetermined time, for example, 5 ms, it is then changed into the READY state, thereby dropping the write signal into a lower level. Likewise, the oscillation control signal and the Vpp generating signal are dropped to a lower level, whereby the oscillating circuit 16 stops oscillating and the switching circuit 18 selects the internal clock signal $\phi_1$ generated by the CPU 21 and supplies it to the control circuit 11 and the timer 12.

When the oscillating circuit 16 is actuated, and thus, the control circuit 11 is operated by the clock signal $\phi_2$ from the clock signal-generating circuit 17, a clock signal may be inhibited from being input into the clock terminal P4 from the external unit, thereby halting the CPU 21 and achieving further power-saving.

Figure 5:
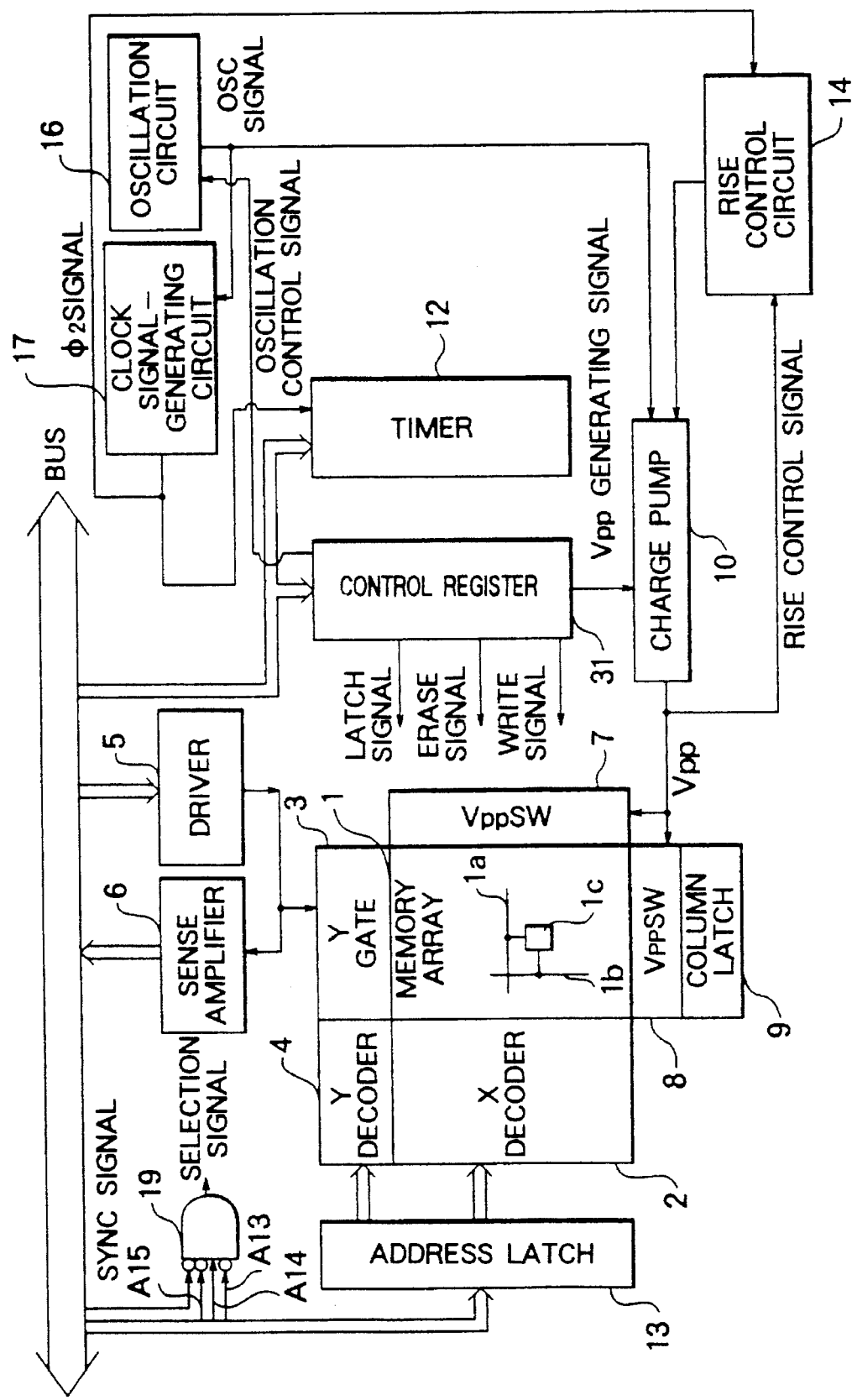
FIG. 5 is a block diagram showing an EEPROM according to another embodiment.
Figure 6:
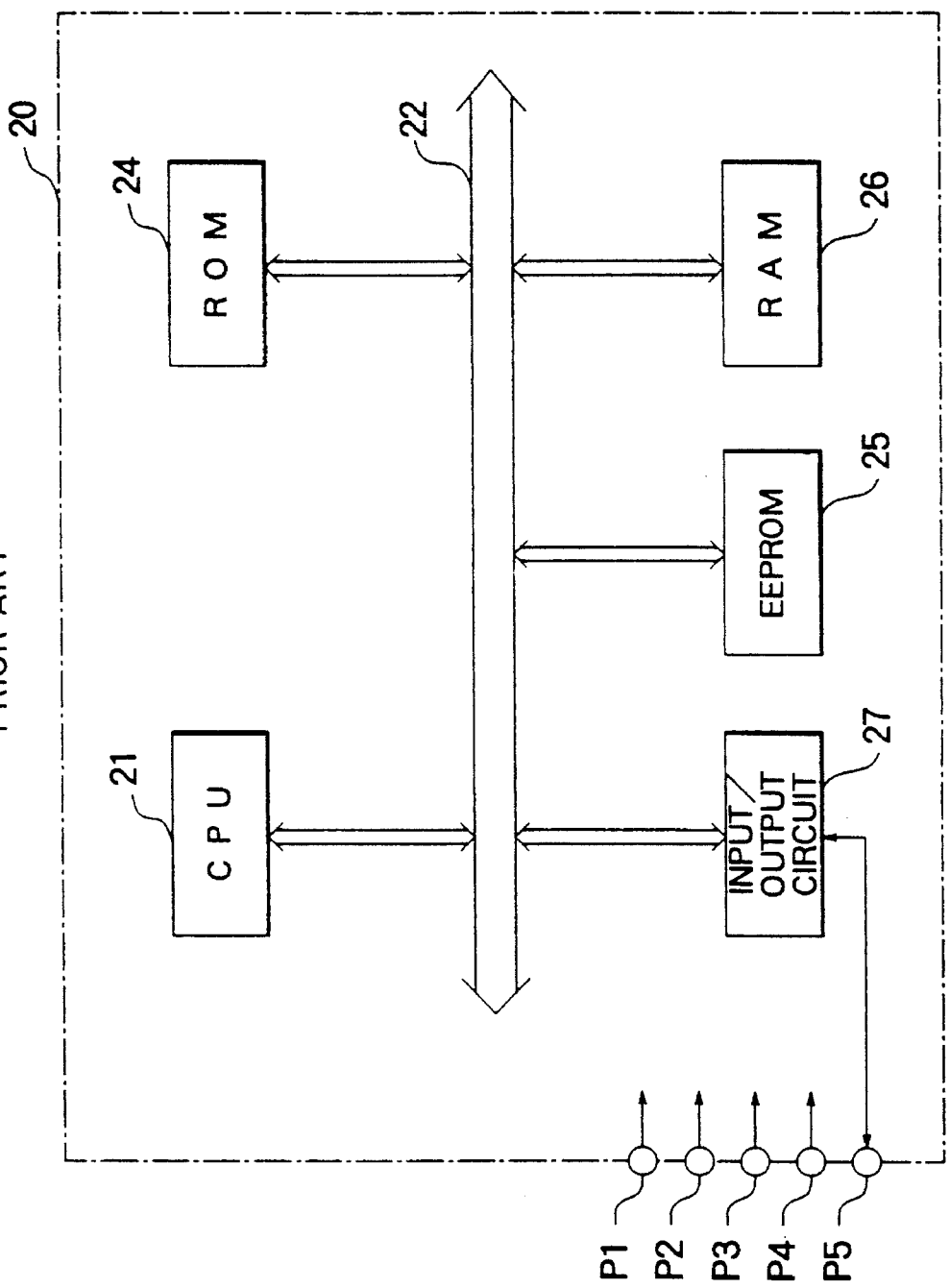
FIG. 6 is a block diagram showing a conventional IC card.

The present invention may be modified as follows. As illustrated in FIG. 5, instead of the control circuit 11, a control register 31 may be arranged to be directly set/reset by the CPU 21, thereby outputting an oscillation control signal and a Vpp generating signal to the oscillating circuit 16 and the charge pump 10, respectively. In this case, the timer 12 is also directly controlled by the CPU 21. Thus, since the control register 31 and the timer 12 are directly controlled by the CPU 21, the switching circuit 18 shown in FIG. 2 is not required.

In the above embodiments, an EEPROM is used as a memory. However, another kind of writable non-volatile memory may be used.

What is claimed is:

1. A semiconductor integrated circuit comprising:

a non-volatile memory for storing stored data, from which stored data can be erased, and from which stored data may be read;

a writing voltage-generating circuit for generating a writing voltage and supplying the writing voltage to said non-volatile memory for storing data in said non-volatile memory;

an oscillating circuit, including a clock signal-generating circuit and an oscillation circuit, for generating a first clock signal and supplying the first clock signal to said writing voltage-generating circuit;

a timer for measuring duration of application of the writing voltage generated in said writing voltage-generating circuit to said non-volatile memory;

a control circuit for controlling storing of data in said non-volatile memory; and switching means for selecting one of the first clock signal generated in said oscillating circuit and a second, external clock signal input to said semiconductor integrated circuit in response to a control signal supplied to said switching means by said control circuit, thereby supplying the selected one of the first and second clock signals to said timer and said control circuit as a clock.

2. The semiconductor integrated circuit according to claim 1 wherein said control circuit outputs a high-level oscillation control signal to said switching means so that the writing voltage is applied to said non-volatile memory from said writing voltage-generating circuit and a low-level oscillation control signal to said switching means so that the writing voltage is not applied to said non-volatile memory and wherein said switching means selects the first clock signal and supplies the high-level oscillation clock signal to said timer and said control circuit when the first control signal is output by said control circuit and said switching means selects the second clock signal and supplies the second control signal to said timer and said control circuit when the low-level oscillation control signal is output by said control circuit.

3. The semiconductor integrated circuit according to claim 2 comprising a latch circuit for temporarily latching and storing a plurality of data items in order to write the data items simultaneously on a corresponding word line of said non-volatile memory, said timer measuring a time interval for latching data by said latch circuit wherein, when the time interval exceeds a predetermined interval, said control circuit nullifies data previously stored in said latch circuit.

4. The semiconductor circuit according to claim 1 wherein said non-volatile memory is an EEPROM.

5. An IC card comprising:

a central processing unit (CPU) for processing data in response to a second clock signal;

a read only memory (ROM) storing a program for operating said CPU;

a random access memory (RAM) for temporarily storing data;

an input/output circuit for data communication with an external unit;

a non-volatile memory for storing stored data, from which stored data can be erased, and from which stored data may be read;

a writing voltage-generating circuit for generating a writing voltage and supplying the writing voltage to said non-volatile memory for storing data in said non-volatile memory;

an oscillating circuit, including a clock signal-generating circuit and an oscillation circuit, for generating a first clock signal and supplying the first clock signal to said writing voltage-generating circuit;

a timer for measuring duration of application of the writing voltage generated in said writing voltage-generating circuit to said non-volatile memory;

a control circuit for controlling storing of data in said non-volatile memory; and switching means for selecting one of the first clock signal generated in said oscillating circuit and a second, external clock signal input supplied to said switching means by said CPU in response to a control signal from said control circuit, thereby supplying the selected one of the first and second clock signals to said timer and said control circuit as a clock.

6. The IC card according to claim 5 wherein said control circuit outputs a high-level oscillation control signal to said switching means so that the writing voltage is applied to said non-volatile memory from said writing voltage-generating circuit and a low-level oscillation control signal to said switching means so that the writing voltage is not applied to said non-volatile memory and wherein said switching means selects the first clock signal and supplies the first clock signal to said timer and said control circuit when the high-level oscillation control signal is output by said control circuit and said switching means selects the second clock signal and supplies the low-level oscillation clock signal to said timer and said control circuit when the second control signal is output by said control circuit.

7. The IC card according to claim 6 comprising a latch circuit for temporarily latching and storing a plurality of data items in order to write the data items simultaneously on a corresponding word line of said non-volatile memory, said timer measuring a time interval for latching data by said latch circuit wherein, when the time interval exceeds a predetermined interval, said control circuit nullifies data previously stored in said latch circuit.

8. The IC card according to claim 5 wherein said non-volatile memory, said writing voltage-generating circuit, said oscillating circuit, said timer, said control circuit and said switching means are included in an integrated EEPROM.

9. The IC card according to claim 5 wherein said CPU inhibits input of the second clock signal when said switching means selects the first clock signal.

10. An IC card comprising:

a central processing unit (CPU) for processing data in response to a second clock signal;

a read only memory (ROM) storing a program for operating said CPU;

a random access memory (RAM) for temporarily storing data;

an input/output circuit for data communication with an external unit;

a non-volatile memory for storing stored data can be stored, from which stored data can be erased, and from which stored data may be read;

a writing voltage-generating circuit for generating a writing voltage and supplying the writing voltage to said non-volatile memory for storing data in said non-volatile memory;

an oscillating circuit, including a clock signal-generating circuit and an oscillation circuit, for generating a first clock signal and supplying the first clock signal to said writing voltage-generating circuit;

a timer, controlled by said CPU, for measuring duration of application of the writing voltage generated in said writing voltage-generating circuit to said non-volatile memory; and a control register directly set and reset by said CPU, said control register controlling storage of data in said non-volatile memory.

* * * * *